US006397456B1

(12) United States Patent
Roos

(10) Patent No.: US 6,397,456 B1
(45) Date of Patent: Jun. 4, 2002

(54) METHOD AND A MACHINE FOR AUTOMATIC MOUNTING OF COMPONENTS AND A PICK-UP HEAD FOR SUCH A MACHINE

(75) Inventor: Peter Roos, Stockholm (SE)

(73) Assignee: Mydata Automation AB, Bromma (SE)

( * ) Notice: Subject to any disclaimer, the term of this patent is extended or adjusted under 35 U.S.C. 154(b) by 0 days.

(21) Appl. No.: 09/284,293

(22) PCT Filed: Oct. 14, 1997

(86) PCT No.: PCT/SE97/01716

§ 371 (c)(1),
(2), (4) Date: Aug. 9, 1999

(87) PCT Pub. No.: WO98/17092

PCT Pub. Date: Apr. 23, 1998

(30) Foreign Application Priority Data

Oct. 14, 1996 (SE) ................................................ 9603750

(51) Int. Cl.[7] .............................................. B23P 19/00
(52) U.S. Cl. ............................. 29/740; 29/832; 29/840
(58) Field of Search ........................ 29/740, 832, 840, 29/833; 310/12

(56) References Cited

U.S. PATENT DOCUMENTS

| | | | |
|---|---|---|---|
| 4,626,749 A | | 12/1986 | Asakawa |
| 4,705,311 A | * | 11/1987 | Ragard ............................ 294/2 |
| 4,980,971 A | * | 1/1991 | Bartschat et al. ............. 29/833 |
| 5,040,291 A | * | 8/1991 | Janisiewicz et al. .......... 29/840 |
| 5,084,959 A | * | 2/1992 | Ando et al. .................... 29/740 |
| 5,113,565 A | * | 5/1992 | Cipolla et al. .............. 29/25.01 |
| 5,233,745 A | * | 8/1993 | Morita .......................... 29/705 |
| 5,809,639 A | * | 9/1998 | Alvite ........................... 29/740 |
| 5,862,586 A | * | 1/1999 | Kimura ......................... 29/832 |
| 5,864,944 A | * | 2/1999 | Kashiwagi et al. ........... 29/833 |
| 5,896,652 A | * | 4/1999 | Tagata et al. ................. 29/833 |

FOREIGN PATENT DOCUMENTS

| | | | |
|---|---|---|---|
| JP | 61-50002 | * | 3/1986 |
| JP | 63-168096 | | 7/1988 |
| JP | 63-168098 | | 7/1988 |
| JP | 2-214200 | * | 8/1990 |
| JP | 4-72797 | * | 3/1992 |
| JP | 4-359599 | * | 12/1992 |
| JP | 5-37194 | * | 2/1993 |

OTHER PUBLICATIONS

Patent Abstracts of Japan, vol. 96, No. 6, E–xxx Abstract of JP 8–56095 A (Fuji Mach Mfg Co Ltd), Feb. 27, 1996.
Patent Abstracts of Japan, vol. 15, No. 359, E–1110, Abstract of JP 3–141700 A (Matsushita Electric Works Ltd), Jun. 17, 1991.

* cited by examiner

Primary Examiner—Lee Young
Assistant Examiner—Joseph C. Merek

(57) ABSTRACT

On a carriage (43) which is movable in a horizontal direction (X-direction) in an automatic component mounting machine a slide (41) is arranged which is movable vertically (in the Z-direction). The slide (41) carries a plurality of pick-up devices or pipettes (49), which by means of arms (47) are movably mounted in XY-tables attached to the slide. The XY-tables allow that the arms (47) and thus the pipettes can move, during the different movements of the carriage (43) and the slide (41), to different positions which are accurately controllable. Tee carriage can thus fetch components (51) and then have the pipettes (49) in some positions in relation to each other and then, during the displacement of the carriage to the position above a printed circuit board, the pipettes are allowed to be displaced to other positions in relation to each other, which are adapted to the intended places of the components on the printed circuit board. This reduces the total number of movements which the carriage (43) and the slide (41) have to perform and gives a lower total mounting time. The XY-tables can be electric linear n advantageously electrical XY-motors comprising armatures attached to the arms (47), which run between plate shaped stator parts (55, 55'), which carry electrical coils. For a suitable activation of these coils the armatures are made to move to the intended positions.

9 Claims, 2 Drawing Sheets

METHOD AND A MACHINE FOR AUTOMATIC MOUNTING OF COMPONENTS AND A PICK-UP HEAD FOR SUCH A MACHINE

TECHNICAL FIELD

The present invention relates to a pick-up head for a component mounting machine, in particular a mounting machine for automatically mounting electronic and similar components, and it also relates to such a mounting machine and methods of mounting or placing components on substrates.

BACKGROUND

Automatic mounting machines for electronic components can be provided with a pick-up head, which fetches electronic components from different magazines and places them at accurately determined places on a circuit board. The transport from the magazine always requires some time period to be performed. Different proposals have previously been made and also been reduced to practice in existing machines in order to reduce this time period, which can be particularly embarrassing and result in that the mounting work takes a long time for the common case that many components are to be mounted on each circuit board and the pick-up head can only fetch one component in each fetching movement. In order to reduce the transport time a plurality of components can be simultaneously fetched, see the published International patent application WO 96/12394. Here a multitude of pipettes are mounted in a line configuration at a pick-up head on an X-carriage. The pipettes are movable vertically along vertical axes, which are stationary in relation to the pick-up head and to the carriage, and the pipettes can also be rotated about vertical axes to desired angular positions. However, also in this design the pick-up head must move a significant distance vertically between pick-up operations and between each delivery of a component and furthermore, also through some horizontal distance.

Picking-up pipettes or similar gripping devices in automatic component mounting machines are usually made to be capable of both a vertical movement and a rotational movement about a vertical axis which is fixed in the horizontally movable part, such as a turret or X-carriage, see e.g. the published Japanese patent applications JP 80-056095, 64-280663, 63-168096, 63-169098.

SUMMARY

It is an object of the invention to provide a pick-up head for an automatic component mounting machine, by means of which the mounting times can be reduced and in particular the movements of the pick-up head, both vertically and horizontally, both when picking components and when delivering the components at intended places can be reduced.

Thus, a pick-up head or slide is capable of picking a plurality of components in basically one movement, i.e. substantially simultaneously, from magazines holding the components. The slide is also capable of placing the plurality of picked-up components at a circuit board in basically one movement, i.e. also substantially simultaneously. Therefor, the slide comprises a plurality of pick-up devices that are movable individually in the plane of the surface of the board at which they are to be placed. During the movements of the pick-up head from the component magazines to the board and back from the board to the component magazines, which movements are suitably made by displacing a carriage or similar device, at which the pick-up head is mounted, the relative positions of the pick-up devices are re-arranged, both by a movement in said plane and by rotating the pick-up devices if required. This relative rearrangement is necessary since the positions of the components in the magazines generally do not correspond to those positions at which the components are to be placed on the board or at which components have been placed on the board in a previous movement for placing components. The simultaneous picking and placing operations, each in basically only one movement, and the efficient use of the time period for transport between the pick-up place and the placing position result in a very fast total mounting operation and a small total mounting time.

Each pick-up device comprises advantageously a pipette, operated by a negative pressure, or a similar gripping device which has a limited movement in directions perpendicular to the surface of the board but which can be rotated about an axis perpendicular to the board and which furthermore comprises an arm. The arm is mounted in an XY-table for movements in a plane, so that the relative movements of the pipette are achieved by operating the XY-table to move the arm and thus the pipette. A plurality of such XY-tables can be mounted on top of each other on the slide.

Generally, a pick-up head or slide for an automatic mounting machine comprises as conventional at least one pick-up device, which can pick up one component in a movement in a first, usually vertical direction. Control means are associated with the pick-up device in order to displace, after picking up a component, the pick-up device in relation to the pick-up head in directions perpendicular to the first direction, typically in two horizontal directions. In particular the pick-up device can be displaced in a second direction, the second direction being substantially perpendicular to the first direction, and also in a third direction, the second direction and the third direction being substantially perpendicular to the first direction and forming a large angle to each other and preferably being perpendicular to each other. Advantageously at least two pick-up devices are provided, with each one of which an individual control means is associated for displacing a picked-up component in the perpendicular directions. The pick-up devices are mounted on a slide of the pick-up head holding the control devices, the slide performing the picking-up movement in the first direction in relation to the rest of the pick-up head. Thus all pick-up devices are given common movements in the first direction by moving the slide, both for picking components and for placing components.

BRIEF DESCRIPTION OF THE DRAWINGS

The invention will now be described by way of a non-limiting embodiment with reference to the accompanying drawings, in which.

DETAILED DESCRIPTION

Figure 1:
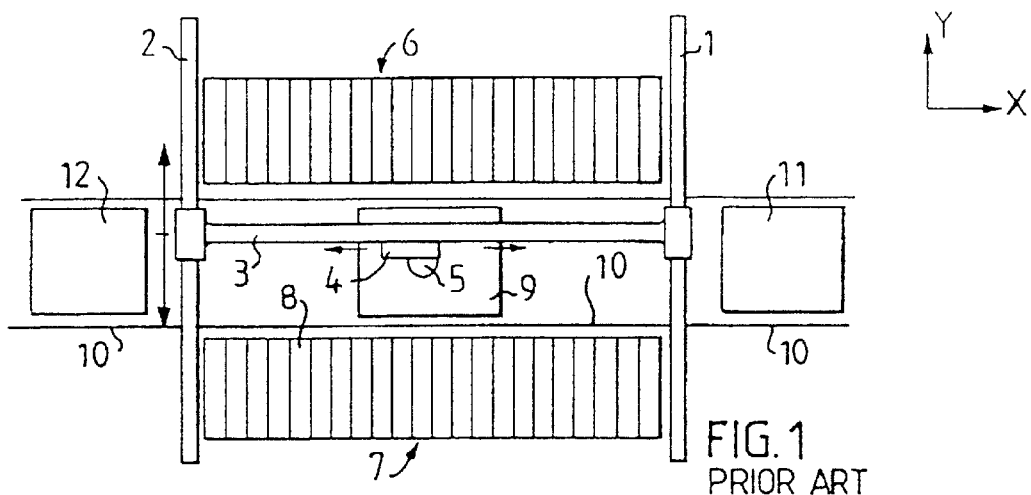
FIG. 1 is a schematic view from above of a prior art automatic component mounting machine having a fixed X-axis and a moving Y-axis.
Figure 2:
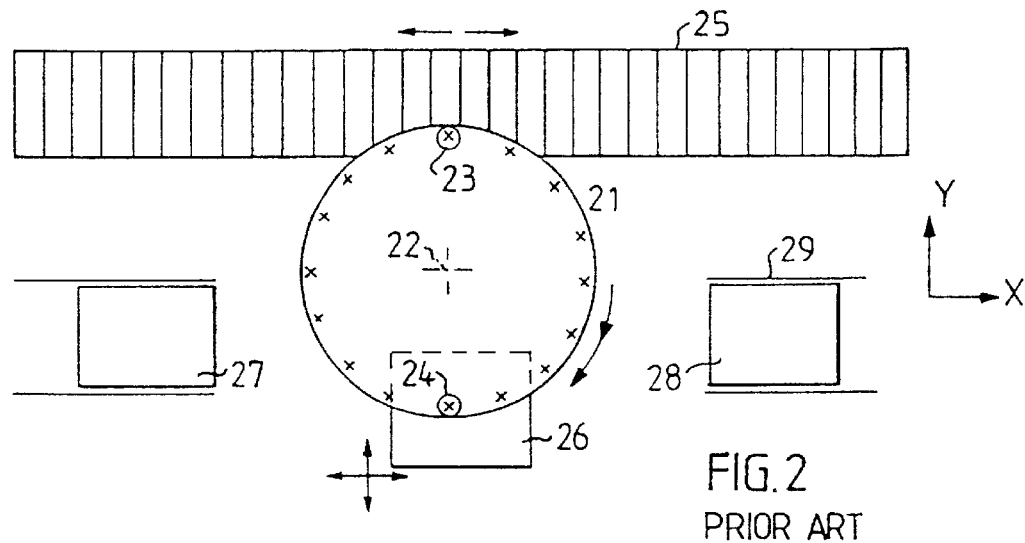
FIG. 2 is a schematic view from above of a prior art automatic component mounting machine of the rotary turret type.
Figure 3:
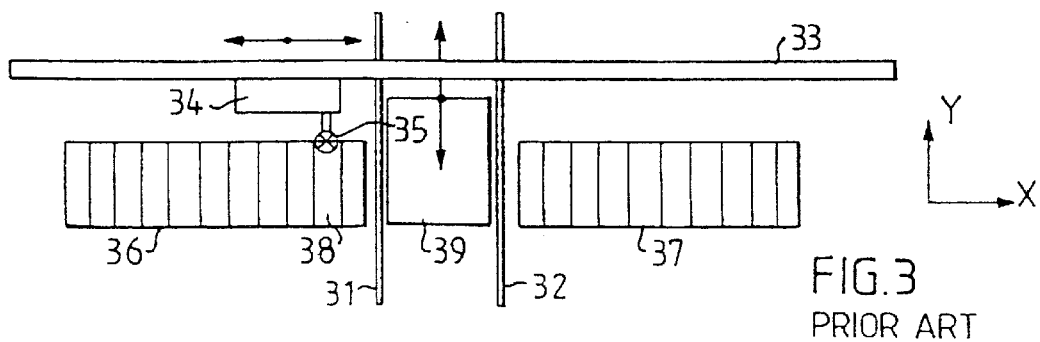
FIG. 3 is a schematic view from above of a prior art automatic component mounting machine having a fixed X-axis and a fixed Y-axis.

Automatic machines for mounting or assembly can be one of three main types which are indicated in FIGS. 1–3, where FIG. 1 shows a fixed X-axis, moving Y-axis machine. FIG. 2 a rotary turret machine and FIG. 3 a fixed X-axis, fixed Y-axis machine.

Thus, FIG. 1 schematically illustrates a machine having a fixed Y-axis defined by two linear bearings 1 and 2 and an X-axis or X-guide 3 that is movable along the Y-axis. A carriage 4 is movable along the X-axis. On this carriage, there is/are one or several pick-up heads. The machine picks components from the component magazine banks 6 and 7 by moving the pick-up head 5 to a position above the selected component feeder, e.g. feeder 8, and thereafter it moves the carriage together with the pick-up head, so that the pick-up head comes above the printed circuit board 9, which is stationary during the assembly operation. A conveyor 10 runs in the X-direction of the machine performing an automatic exchange of circuit boards. An assembled board in position 9 can be moved to the right on the conveyor 10 passing position 11 and a new board 12 can enter the machine from the left.

FIG. 2 shows a machine having a turret 21 that stepwise rotates about an axis 22 that is stationary or fixed as seen in the X-and Y-directions, The turret 21 has a number of pick-up heads such as 23 and 24 mounted in different positions at the periphery of the turret. The machine picks components from a magazine bank 25 by moving the whole bank 25 in the X-direction so that the feeder with the wanted component is placed in the pick-up position 23, which basically is fixed or stationary. The component is picked up in this position 23 and is retained by the turret 21 during the stepwise movement of the turret and will be mounted on a board 26 when the head that picked the component reaches position 24. The board 26 is moved so that the correct part of the board is placed below the placement position 24. A board to be assembled on the input conveyor is waiting in position 27 and a board that immediately before has been assembled is in position 28, ready to be moved to the right on a conveyor 29.

FIG. 3 shows a machine having a fixed Y-axis defined by two linear bearings 31 and 32. The fixed X-axis is shown as 33. A carriage 34 on which one or several pick-up heads 35 are mounted can move along the X-axis in the X-direction. The machine picks components from two magazine banks 36 and 37 by moving the head 35 to a position above the selected feeder, for example 38, and mounts the component on the board 39 which is movable in the Y-direction.

Figure 4:
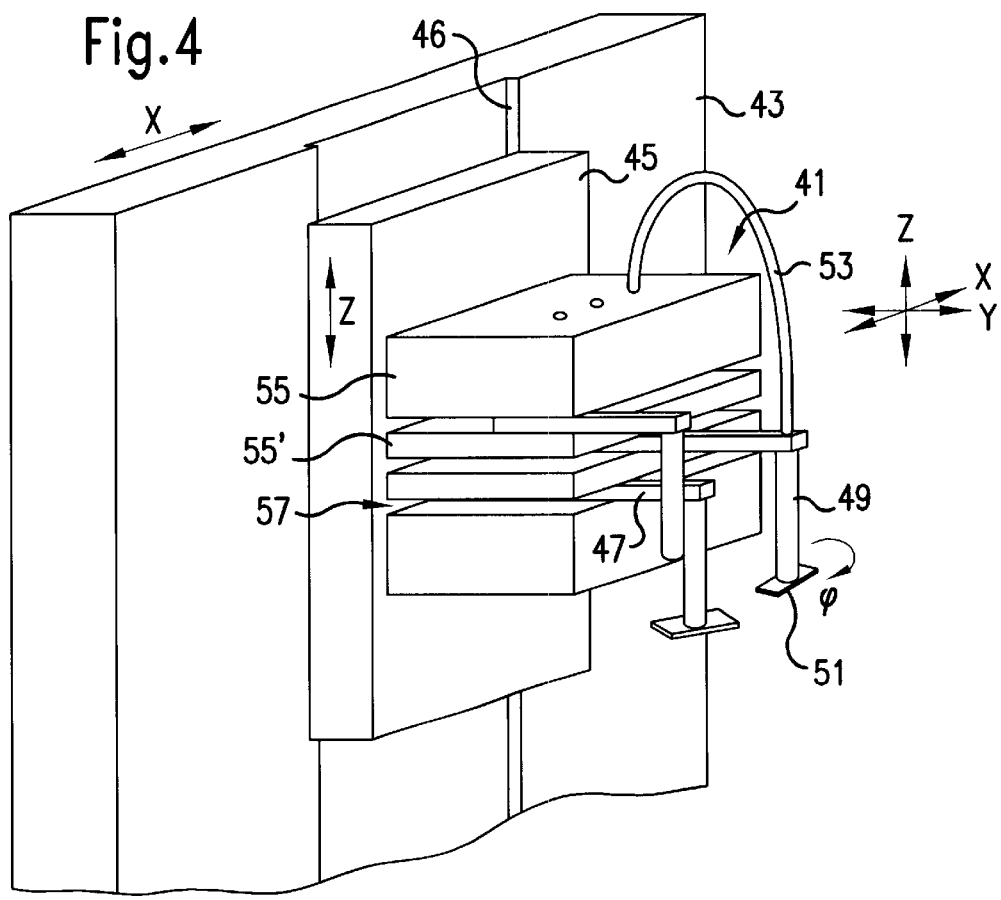
FIG. 4 is a perspective view of a carriage for a component mounting machine, the carriage being displaceable in a horizontal direction and having a pick-up head arranged thereon.

In such automatic mounting machines for electronic components of for example the standard types illustrated in FIGS. 1–3, a pick-up head 5; 23, 24; 35 is used, which performs vertical movements when positioned at appropriate places for picking a component and for releasing it at a position on a circuit board. The pick-up head is slidably mounted on a carriage or horizontally movable support, such as the carriages 4; 34 in FIGS. 1, 3 and the turret 21 in FIG. 2, allowing the pick-up head to be also displaced along a horizontal path. In FIG. 4 such a slide, pick-up head or component retaining head 41 is shown which is mounted to the front of an X-carriage 43 of e.g. a mounting machine of the type illustrated in FIG. 3 or possibly the X- and Y-carriage 4 of the machine of FIG. 1 but it could equally well be attached to some other movable part of a mounting machine performing basically movements horizontally, all such movable parts herein being called "carriages".

The X-carriage 43 is thus movable horizontally along some guide. The pick-up head 41 comprises a base plate 45, which is movable vertically or in the Z-direction in relation to the carriage 41 along suitable guides, indicated at 46.

To the base plate 45 are control means for accomplishing movement in a plane attached, these control means being illustrated as XY-tables, which each one carries an arm 47 projecting beyond the edge of the XY-tables and thus have an outer, free end. To this free end is a pipette 49 rigidly attached. The pipettes 49 can at their lower ends retain components 51 for transport from component magazines to an accurately determined location on a circuit board. The pipettes 49 are connected to hoses 53 for applying a negative pressure at their lower ends and for displacing the pipettes in a vertical direction, the Z-direction, over a limited distance and for rotating the pipettes along their longitudinal, vertical axes, for adjusting the angle of the pipettes in a horizontal plane in order to set the relative vertical positions and the angles of retained components 51.

Figure 5:
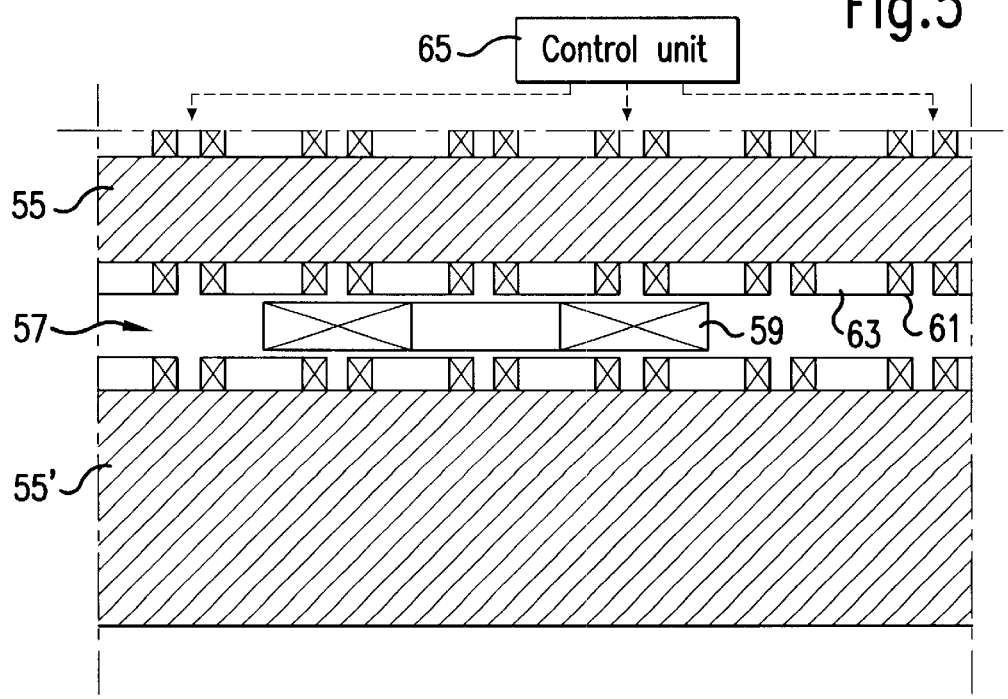
FIG. 5 is a cross-sectional partial view of XY-tables used in the pick-up head of FIG. 4.

The XY-tables which carry the pipette arms 47 can be a developed type of an electric linear motor, see for example U.S. Pat. No. 4,626,749, which can displace, in two perpendicular directions in a plane, an armature that is usually mounted in air bearings in order to give it an accurately defined position in the plane. For this purpose the base plate 45 carries block shaped or plate shaped elements 55, 55', which project perpendicularly from the base plate 47, so that between these elements slots 57 are formed, see also the cross-sectional, fragmentary view of FIG. 5, which are suitable for receiving armatures 59, rigidly connected to the arms 47. The block shaped elements 55, 55' carry at their surfaces, which form the slots 57, electric coils 61 wound around stator poles 63 or they can carry permanent magnets, not shown, which cooperate with and are capable of displacing an armature 59 when they and/or the armature are/is supplied with suitable electrical currents. The supply of currents to the coils 61 and/or armature 59 for each slot 57 is controlled by some intelligent control means of type micro processor, illustrated as the control unit 65 in FIG. 5.

Other kinds of XY-controlling means for the arms 47 can also be used. The requirement is that they must be capable of producing a rather fast but very accurate positioning of the arms. Such two-dimensional position controlling means are for instance used in mechanical XY-plotters and the mechanisms used therein can also be suited for the XY-tables as described above.

When using the pick-up head the carriage 43 is displaced together with the head 41 to a position above magazines which contain components to be mounted. The head 41 is displaced downwards so that the lower surfaces of the pipettes 49, where suitable nozzles, not shown, are arranged, come in contact with the components. The channels of the nozzles are connected to a negative pressure, whereby the intended components are picked. Thereafter the head 41 is moved upwards and the carriage 43 starts its movement to move the pick-up head 45 to a position above an electrically printed circuit board where the components are to be mounted. During these movements also the XY-motors of the XY-tables are activated by supplying suitable electrical currents to their different coil parts. Then the arms 47 move to new positions determined for the intended places of the components on the circuit board. Also, the pipettes 49 are rotated for adjusting their relative angles. When the carriage 43 has achieved a suitable position above the printed circuit board, the head 41 is lowered and the pipettes 49 can deliver the transported components at their positions on the printed circuit board, by removing the negative pressure acting at their lower ends. Thereafter the head 41 is again elevated and the carriage 43 returns to a position above the component magazines. During these return displacements the arms 47 and the pipettes 49 are again given new relative positions which are adapted to the locations of the components in the magazines, by controlling the XY-tables. Then the head 41 is again lowered and components are picked by the pipettes 49 for a new mounting operation.

By this sequence of movements, the time periods always required for movements of a pick-up head from component magazines to the actual mounting place and back are efficiently used for rearranging the individual gripping devices. An automatic mounting machine is thus provided requiring a minimum of total mounting time.

What is claimed is:

1. A pick-up head for an automatic mounting machine for mounting components onto a substrate, the substrate being arranged in a substrate plane, the pick-up head being mounted for movement in X and Z directions and comprising:

a support, a plurality of pick-up devices mounted for movement in X and Y directions parallel to the substrate plane with respect to said support, each of said plurality of pick-up devices being arranged to pick up a component at a predetermined position on the substrate, a control mechanism mounted to the support and associated with the pick-up devices for rearranging the plurality of pick-up devices in the X and Y directions from relative positions corresponding to positions of the components to be picked-up to relative positions corresponding to the predetermined positions on the substrate, said control mechanism including at least one electric linear motor for moving said plurality of pick-up devices in the X and Y directions with respect to said support, and wherein said support includes a plurality of elements mounted to a base plate in vertically spaced relation, each of said plurality of pick-up devices being mounted within the spaces between the elements for movement in the X and Y directions.

2. The pick-up head of claim 1, wherein said control mechanism comprises an armature operatively associated with magnetic poles surrounding a space in which the armature is movably mounted, the space having the shape of one of:

a flat, plate shape or a slot shape.

3. The pick-up head of claim 1, wherein an individual control mechanism is associated with each of the plurality of pick-up devices for rearranging a picked-up component.

4. The pick-up head of claim 1, further comprising means for individually rotating the picked-up devices prior to placing the picked-up components such that the relative angle of each of the picked-up components corresponds to the relative angle at which the picked-up component is to be placed on the substrate.

5. The pick-up head of claim 2, wherein the magnetic poles comprise poles generated by electrical coils.

6. The pick-up head of claim 1, wherein each of said plurality of pick-up devices includes a horizontal arm mounted for movement in the spaces between the elements, and a vertical arm extending in a substantially vertical direction from an end of said horizontal arm, each of said vertical arms being rotatably mounted with respect to a respective of said horizontal arms for rotatably orienting a picked-up component on the substrate.

7. The pick-up head of claim 6, wherein there are a plurality of said electric linear motors for moving a respective of said plurality of pick-up devices, each of said plurality of electric motors comprising:

a plurality of stator poles mounted in said spaces between said elements, each of said plurality of stator poles having electric coils wound thereon; and an armature, said armature being mounted to an end of a respective of said plurality of horizontal arms opposite to the end on which said vertical arm is mounted.

8. The pick-up head of claim 6, wherein each of said plurality of pick-up devices includes a source of negative pressure attached thereto, said source of negative pressure for holding a component on an end of said vertical arm, for rotating said vertical arm, and for moving said vertical arm in a vertical direction with respect to a respective of said plurality of horizontal arms.

9. The pick-up head of claim 7, wherein each of said plurality of pick-up devices includes a source of negative pressure attached thereto, said source of negative pressure for holding a component on an end of said vertical arm, for rotating said vertical arm, and for moving said vertical arm in a vertical direction with respect to a respective of said plurality of horizontal arms.

\* \* \* \* \*